US006448770B1

United States Patent
Liu et al.

(10) Patent No.: US 6,448,770 B1
(45) Date of Patent: Sep. 10, 2002

(54) GAIN SELECTION FOR MAGNETIC RESONANCE IMAGING AND SPECTROSCOPY

(75) Inventors: Kecheng Liu, Solon; Gordon D. DeMeester, Wickliffe; Michael Burl, Chagrin Falls, all of OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/538,173

(22) Filed: Mar. 30, 2000

(51) Int. Cl.$^7$ ................................. G01V 3/00
(52) U.S. Cl. .................. 324/307; 324/309; 324/322
(58) Field of Search ................. 324/309, 307, 324/318, 322, 313, 314

(56) References Cited

U.S. PATENT DOCUMENTS

| | | | | |
|---|---|---|---|---|
| 4,665,364 A | * | 5/1987 | Hanawa | 324/309 |
| 4,700,138 A | * | 10/1987 | Shimazaki et al. | 324/322 |
| 5,023,552 A | * | 6/1991 | Mehlkopf et al. | 324/309 |
| 5,093,621 A | * | 3/1992 | Den Boef et al. | 324/309 |
| 5,140,268 A | * | 8/1992 | Chan | 324/314 |
| 5,268,640 A | * | 12/1993 | Du et al. | 324/309 |
| 5,451,876 A | | 9/1995 | Sandford et al. | 324/322 |
| 6,043,659 A | * | 3/2000 | McKinnon | 324/322 |

FOREIGN PATENT DOCUMENTS

EP     0 380174 A1     8/1990

OTHER PUBLICATIONS

R. L. Greenman, et al., "Bilateral Imaging Using Separate Interleaved 3D Volumes and Dynamically Switched Multiple Receive Coli Arrays," MRM, 1998, 39:108–115.

* cited by examiner

Primary Examiner—Edward Lefkowitz
Assistant Examiner—Tiffany A. Fetzner
(74) Attorney, Agent, or Firm—Fay, Sharpe, Fagan, Minnich & McKee, LLP

(57) ABSTRACT

A method of magnetic resonance imaging includes supporting a subject in an examination region of an MRI scanner (A). An MRI pulse sequence is applied to produce a detectable magnetic resonance signal (100) in a selected region of the subject. The magnetic resonance signal (100) includes a plurality of echos (102a–h) which are received. The plurality of received echos (102a–h) are subjected to a controllable gain factor such that at least two echos are subjected to different gain factors. In this manner, for example, a multi-contrast acquisition and imaging experiment may be achieved with each set of acquired echos and/or each image having a separately optimized (e.g., optimized for SNR considerations) gain factor individually selected and/or set therefor.

18 Claims, 4 Drawing Sheets

GAIN SELECTION FOR MAGNETIC RESONANCE IMAGING AND SPECTROSCOPY

BACKGROUND OF THE INVENTION

The present invention relates to the diagnostic medical imaging and spectroscopy arts. It finds particular application in conjunction with magnetic resonance imaging (MRI) scanners, and will be described with particular reference thereto. However, it is to be appreciated that the present invention is also amenable to other like applications.

Commonly, in MRI, a substantially uniform temporally constant main magnetic field, $B_0$, is set up in an examination region in which a subject being imaged or examined is placed. Nuclei in the subject have a spin which in the presence of the main magnetic field produce a net magnetization. The nuclei of the spin system precess in the magnetic field at the Larmor frequency, i.e., the resonant frequency. Radio frequency (RF) magnetic fields at and/or near the resonant frequency are used to manipulate the net magnetization of the spin system. Among other things, RF magnetic fields at the resonant frequency are used to, at least partially, tip the net magnetization from alignment with the main magnetic field into a plane transverse thereto. This is known as excitation, and the excited spins produce a magnetic field, at the resonant frequency, that is in turn observed by a receiver system. Shaped RF pulses applied in conjunction with gradient magnetic fields are used to manipulate magnetization in selected regions of the subject and produce a magnetic resonance (MR) signal. The resultant MR signal may be further manipulated through additional RF and/or gradient field manipulations to produce a series of echos (i.e., an echo train) as the signal decays. The various echos making up the MRI signal are typically encoded via magnetic gradients set up in the main magnetic field. The raw data from the MRI scanner is collected into a matrix commonly known as k-space. Typically, each echo is sampled a plurality of times to generate a data line or row of data points in k-space. The echo or data line's position in k-space (i.e., its relative k-space row) is typically determined by its gradient encoding. Ultimately, in an imaging experiment, by employing Inverse Fourier or other known transformations, an image representation of the subject is reconstructed from the k-space (or reciprocal space) data.

Often, MR reception systems use a significant signal gain factor (i.e., amplification and/or attenuation) in order to properly fill the range of an employed analog to digital converter (ADC). Previously developed RF reception systems, typically use a single gain factor selected based on a calibration signal. This single gain factor is used for the complete echo train even though an amount of signal received from the echo train can have a large dynamic range. That is to say that signals from an echo train are commonly subjected to a single gain factor (i.e., amplification or attenuation) to achieve a desired result such as improved signal to noise ratio (SNR), avoidance of signal overflow in the ADC, or the like. Yet, a single gain factor is not universally optimal, for all the echos of an echo train, or even for some single echos.

Consider, for example, one known type of MRI experiment, multiple contrast acquisition and imaging. Different tissues of the body have different pairs of relaxation properties that are characterized by a pair of time constants: T1 which is the spin-lattice relaxation time, and T2 which is the spin-spin relaxation time. Therefore, different images and visualization of different anatomical structures are obtained depending upon the time constant most heavily relied upon. In this regard, a T1 weighted image is one in which the intensity contrast between any two tissues in an image is due mainly to the T1 relaxation properties of the tissue, and a T2 weighted image is one in which the intensity contrast between any two tissues in an image is due mainly to the T2 relaxation properties of the tissue. In still another type of contrast image, where the repetition time (TR) for the pulse sequence is long relative to the T1 relaxation properties of all the tissues under consideration, the achieved image is said to be proton density (PD)-weighted in that it reflects an overall proton density distribution.

In an exemplary dual-contrast experiment, two sets of echos out of the same echo train are used to reconstruct two images having different tissue contrast weighting. Typically, a set of later-acquired, smaller-signal echos are used in reconstructing a T2-weighted image, while the set of earlier-acquired, larger-signal echos are used in reconstructing a PD-weighted image. Accordingly, a predetermined gain factor set small enough to accommodate the larger-signal echos without clipping is too small to achieve an optimal SNR for the smaller-signal echos. Conversely, a predetermined gain factor set high enough to optimize the SNR of the smaller-signal echos is too high to accommodate the larger-signal echos without clipping.

There are other kinds of MR sequences, such as single echo volume acquisitions, where the received signal is large compared to the dynamic range of the ADC used to digitize the signal. Usually the received signal has several bits of noise so the real signal is not subjected to digitization noise in the lowest bits. There are many small signals in the acquisition of an image and only a few large signals near the center of k-space. If two or more ADC channels are used, the large signal data can be acquired with one ADC, and gain corrected in the data stream, while the many smaller signals can be received with appropriate gain in another channel.

One type of approach used to address SNR concerns in such circumstances is known as the variable bandwidth method. See, e.g., Greenman, et al., "Bilateral Imaging Using Separate Interleaved 3D Volumes and Dynamically Switched Multiple Receiver Coil Arrays," MRM, (1998), Vol. 39, pp. 108–115, incorporated herein by reference. However, variable bandwidth methods have certain inherent limitations and/or drawbacks. For example, depending on how it is implemented, one may incur undersampling in k-space, and generally, the noise behavior become more difficult to interpret. Moreover, the method employs dynamic timing changes that, technically, are not trivial or easy to implement.

The present invention contemplates a new and improved gain selection technique which overcomes the above-referenced problems and others.

SUMMARY OF THE INVENTION

In accordance with one aspect of the present invention, a method of magnetic resonance imaging includes supporting a subject in an examination region of an MRI scanner. An MRI pulse sequence is applied to produce a detectable magnetic resonance signal in a selected region of the subject. The magnetic resonance signal includes a plurality of echos which are received. The plurality of received echos are subjected to a controllable gain factor such that at least two echos are subjected to different gain factors.

In accordance with another aspect of the present invention, a method of magnetic resonance imaging is provided. It includes supporting a subject in an examination region of an MRI scanner, and applying an MRI pulse sequence to produce a detectable magnetic resonance signal in a selected region of the subject. The magnetic resonance signal comprises one or more echos. The magnetic resonance signal is received and selectively subjected to a variable gain factor. The gain factor affected magnetic resonance signal is sampled into k-space as k-space data, and, thereafter, the k-space data is reconstructed into an image representation of the subject.

In accordance with another aspect of the present invention, an MRI scanner includes a main magnet that generates a substantially uniform temporally constant main magnetic field through an examination region wherein an object being imaged is positioned. The scanner also includes: a gradient magnetic field generator that produces magnetic gradients in the main magnetic field across the examination region, and an RF magnetic field generator which includes an RF transmitter that drives an RF coil which is proximate to the examination region. A sequence control manipulates the gradient magnetic field generator and the RF magnetic field generator to produce an MRI pulse sequence. The MRI pulse sequence produces a detectable magnetic resonance signal, including one or more echos, in the object. A reception system includes a receiver that receives and demodulates the echos, and a gain control that selectively subjects the echos to a variable gain factor. A reconstruction processor reconstructs images of the object from data collected via the reception system, and an output device produces a human viewable rendering of the images.

One advantage of the present invention is separately optimized gain factors individually selected and/or set for each echo or group of echos in various MRI experiments.

Another advantage of the present invention is a high SNR for all the echos or groups of echos collected in an MRI experiment, particularly for echos late in the echo train.

Yet another advantage of the present invention is a dynamically varying gain factor use in connection with a multi-contrast MRI experiment does not affect the noise behavior nor does it introduce undersampling or time limitation problems.

Another advantage of the present invention is that a selectable gain employed during echo acquisition in conjunction with multi-echo multi-contrast experiments improves the SNR of the later echos without changing the sampling linearity or receive bandwidth of the early echos.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limit the invention.

DETAILED DESCRIPTION OF THE PREFERRED EMBODIMENTS

Figure 1:
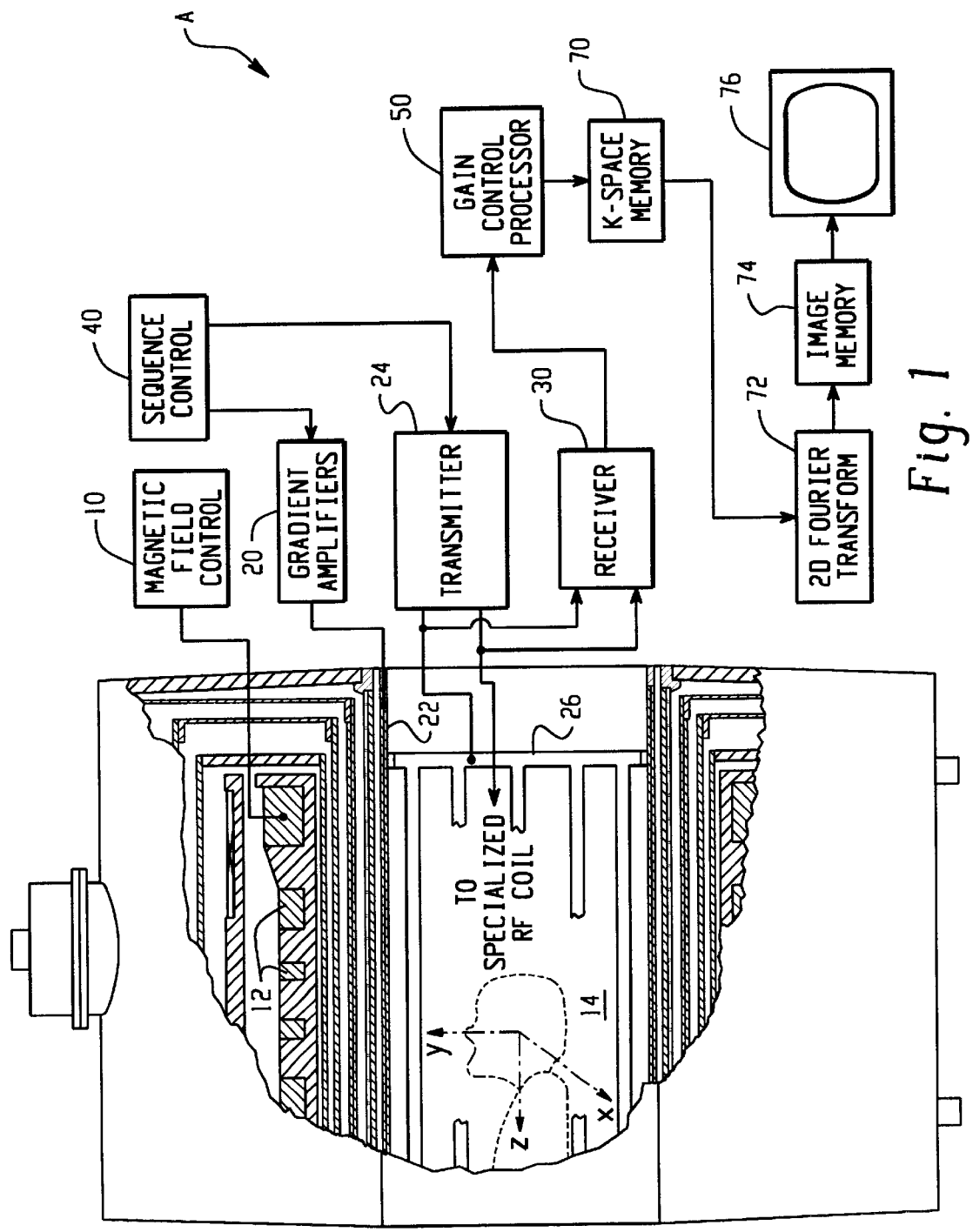
FIG. 1 is a diagrammatic illustration of a magnetic resonate imaging scanner in accordance with aspects of the present invention.

With reference to FIG. 1, an MRI scanner A includes a main magnetic field control 10 that controls superconducting or resistive magnets 12 such that a substantially uniform, temporally constant main magnetic field $B_0$ is created along a z-axis through an examination region 14. An imaging or spectroscopy experiment is conducted by executing a magnetic resonance sequence with the subject being imaged or examined (e.g., patient, phantom, or otherwise) placed at least partially within the examination region 14. The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to selected ones or pairs of whole body gradient coils 22 to create magnetic field gradients along x, y and z-axes of the examination region 14. An RF transmitter 24, optionally digital, applies electrical RF pulses or pulse packets to an RF coil (optionally, a whole-body RF coil 26) to generate RF magnetic fields (at resonance) in the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local transmit and/or receive RF coils are commonly placed surrounding or contiguous to the selected region. For example, as is known in the art, an insertable head coil (not shown) may be inserted surrounding a selected brain region at the isocenter of the bore, a selected surface coil (not shown) may be employed, or another like specialized RF coil may be employed. In addition to generating RF pulses, optionally, the local RF coil also receives magnetic resonance signals from the selected region. In still other embodiments or applications, the whole-body RF coil 26 generates the RF pulses whiles the local RF coil receives the resulting magnetic resonance signals or vice versa.

Regardless of the RF coil configuration, the resultant RF magnetic resonance signals are picked up by one or another of the RF coils employed and demodulated by a receiver 30. A sequence control circuit 40 controls the gradient pulse amplifiers 20 and the RF transmitter 24 to produce any one of a number of pulse sequences. The generated magnetic resonance (MR) signals are received and sampled by the receiver 30.

Figure 2:
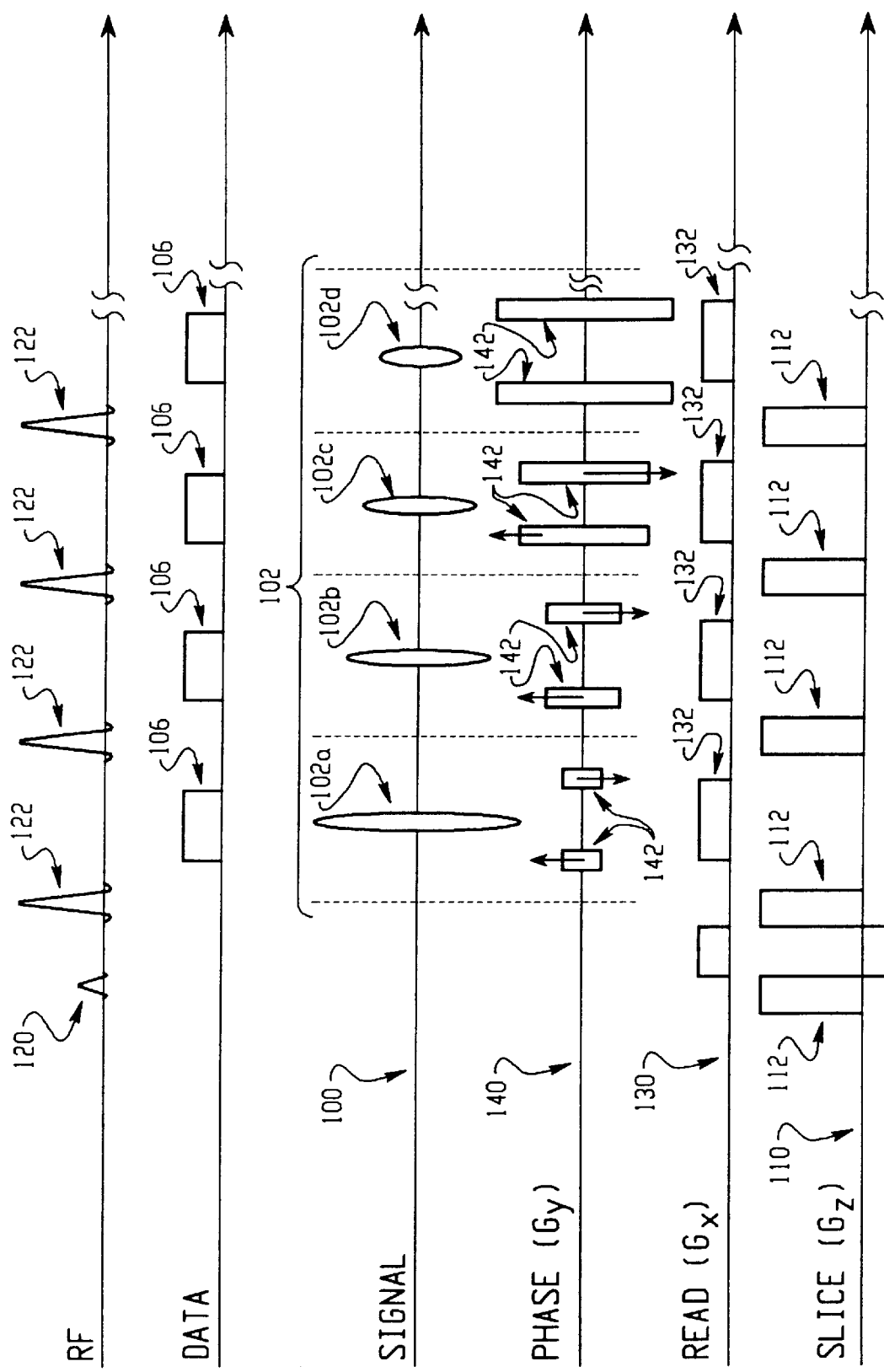
FIG. 2 is a diagrammatic illustration of an MRI pulse sequences produced in accordance with aspects of the present invention.

More specifically, a fast spin echo (FSE) MRI sequence is described by way of the example sequence depicted in FIG. 2. Each MRI pulse sequence generates an MR signal 100 which emanates from the subject being imaged or examined. The MR signal 100 includes an echo-train 102 having a number of echos (preferably, between 16 and 64 echos). In one preferred embodiment of the present invention, the MRI pulse sequence is an FSE sequence generating a number of spin echos 102*a*–*d* (in the interest of simplicity, only four of the preferred 16 to 64 echos are illustrated) which correspond to the echo-train 102. While an FSE sequence is illustrated in this exemplary embodiment, it is to be understood that other multi-shot or multi-echo sequences are optionally employed. In any event, the echos 102*a*–*d* are collected within a data acquisition window 106.

During a slice selection sequence 110, gradient pulses 112 are applied to the gradient coil assembly 22 to set up conditions for slice selection within the subject where resonant excitation will be preformed and from which an echo train 102 will ultimately be detected. Simultaneous with the slice selective gradient pulses 112, RF pulses are applied to the appropriate RF magnetic field generating coil via the RF transmitter 24. The simultaneous application of the RF and gradient pulses is used to spatially select the regions in which to manipulate the net magnetization. In the exemplary sequence, the RF pulses produce an initial 90° magnetization flip in conjunction with an excitation pulse 120. The excitation pulse 120 is then followed by a series of 180° flip angle refocusing pulses 122. The application of each refocusing pulse 122 results in the generation of a spin echo thereafter.

A readout pulse sequence 130 applied to the gradient coil assembly 22 frequency encodes the received MR signal 100 along a first direction within the selected slice. The echoes are read out under readout gradient pulses 132. In addition to frequency encoding, the received MR signal 100 is also phase encoded via a phase encode pulse sequence 140 applied to the gradient coil assembly 22. The phase encode pulse sequence 140 includes a number of pairs of equal amplitude opposite polarity phase encode gradient pulses 142 which are applied before and after the echos 102*a*–*d* to impart phase encoding before the echo and remove it after the echo. The phase encoding is applied along a second direction within the selected slice which second direction is orthogonal to the first, frequency encoding or read direction. The individual echoes 102*a*–*d* are separately phase encoded by varying the amplitude and/or duration of the phase encoding gradient pulses 142.

As shown in FIG. 1, downstream from the receiver 30 is a gain control processor 50. The gain control processor 50 selectively subjects received echos to a variable gain factor, and preferably, serves to convert the MR signals from analog to digital. Optionally, the receiver 30 is a digital receiver, in which case, the gain control processor 50 is interposed upstream from the receiver 30, i.e., between the receiver 30 and the relevant RF coil. In either case, the gain adjusted echos are sampled into k-space as k-space data. Preferably, the k-space data is stored in a memory 70 or other like storage device.

Ultimately, for an imaging experiment, a reconstruction processor 72, acting on the k-space data from the memory 70, reconstructs an image representation of the subject by applying a two-dimensional (2D) Fourier transform or other appropriate reconstruction algorithm. The image may represent a planar slice through the subject, an array of parallel planar slices, a three-dimensional volume, or the like. The image is then stored in an image memory 74 where it may be accessed by a display, such as a video monitor 76 which provides a human-readable display or rendering of the resultant image.

Figure 3A:
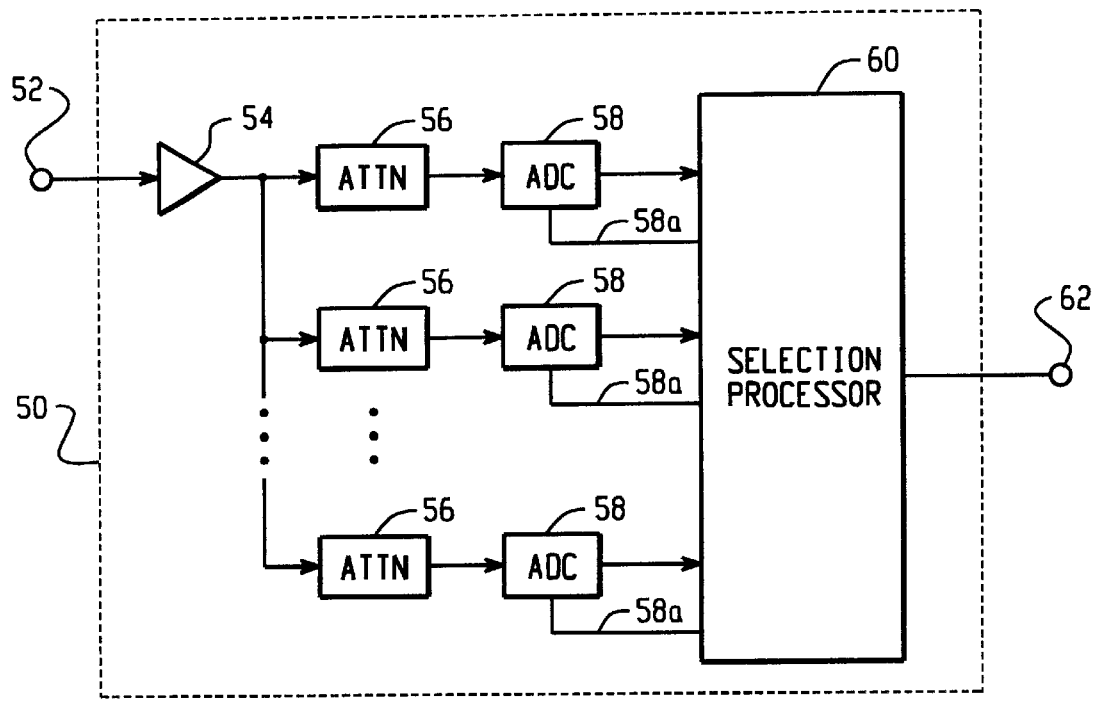
FIGS. 3A and 3B are diagrammatic illustrations of gain control processors, in accordance with aspects of the present invention; and, FIG. 4 is a diagrammatic illustration of an MR signal used in accordance with aspects of the present invention.

More specifically, with further reference to FIG. 3A, the gain control processor 50 is preferably implemented using a plurality of processing channels, each channel providing a different gain factor (in the interest of simplification, only three channels are shown). After initial gain, the gain factor represents an additional amplification or attenuation of each echo amplitude. As shown, the MR signal or echo is introduced into the gain control processor 50 at the input 52. In a preferred embodiment, an amplifier 54 amplifies the MR signal or echo prior to its application to the plurality of channels. Each channel includes an attenuator 56 and an analog to digital converter(ADC) 58. The attenuators 56 for each channel are set to attenuate the MR signal or echo by a different amount, e.g., 0 dB, 6 dB, 12 dB, 18 dB, etc. In this manner, the different gain factors for each channel are determined by the amplification from the amplifier 54 in conjunction with the respective attenuation from the attenuators 56. Alternately, the configuration is reversed. That is, a sole attenuator 56 optionally takes the place of the amplifier 54 and each channel has a distinct amplifier 54 with a different amplification in place of the attenuators 56. In yet another embodiment, after initial amplification, each channel is provided with a separate amplifier/attenuator that provides a different gain factor for their respective channels.

For each channel then, the gain factor affected MR signal or echo is converted from an analog signal to a digital signal by the corresponding ADC 58. The ADCs 58 are preferably matched and/or calibrated to account for inconsistencies in processing times or delays and any inherent gain associated therewith. Where an input to an ADC 58 exceeds a defined amplitude limit, signal clipping occurs. Preferably, in response to signal clipping in the ADCs 58, the affected ADCs 58 set a flag or overflow bit on corresponding output lines 58*a* indicating that the signal processed by the ADC 58 was, in fact, clipped.

In a preferred embodiment, the channels are routed through a selection circuit or processor 60 that determines the channel from which a selected MR signal or echo is to be taken. That is, the selection processor 60 passes a selected channel to the output 62 of the gain control processor 50 depending on the gain factor affected MR signal or echo desired. The output lines 58*a* are also fed to the selection processor 60 in order to communicate which channels are carrying clipped signals. In this manner, the variable gain factor is selected and/or set to a desired level for each echo.

In an alternate embodiment, the multiple channels are optionally supported by a multi-channel receiver 30.

Figure 3B:
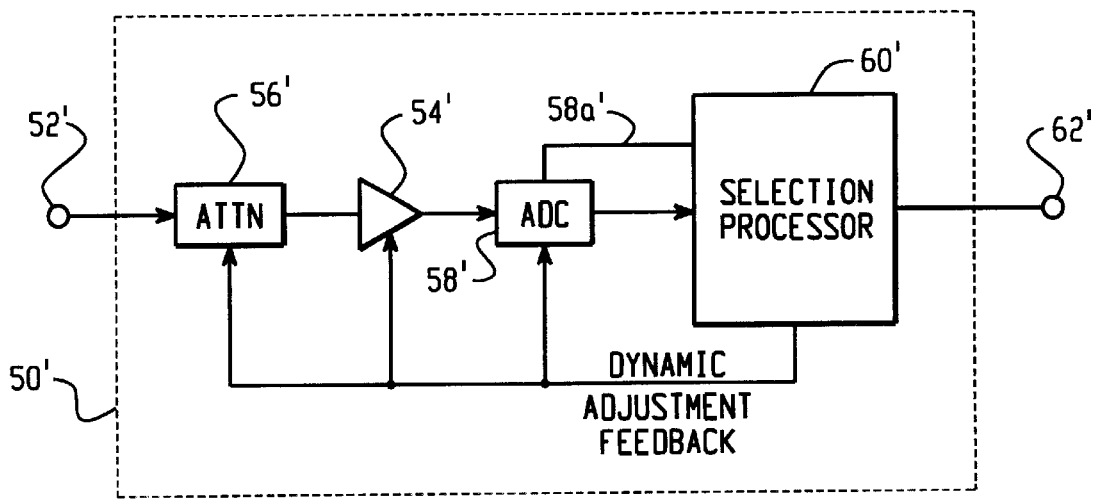

With further reference to FIG. 3B, another preferred embodiment is shown wherein elements therein (i.e., 50', 52', 54', 56', 58', 58*a*', 60' and 62') are labeled with primed reference numbers that are the same as the unprimed reference numbers used to label corresponding or like elements (i.e., 50, 52, 54, 56, 58, 58*a*, 60 and 62) shown in FIG. 3A. In the embodiment shown in FIG. 3B, the gain control processor 50' is implemented as a single processing channel. The channel preferably includes one or both of an amplifier 54' and an attenuator 56', either or both of which are dynamically adjustable to control the gain factor applied to the MR signal or echo routed through the channel. Likewise, the ADC 58' is also dynamically adjustable. In this manner, again, the variable gain factor is selected and/or set to a desired level for each echo.

Figure 4:
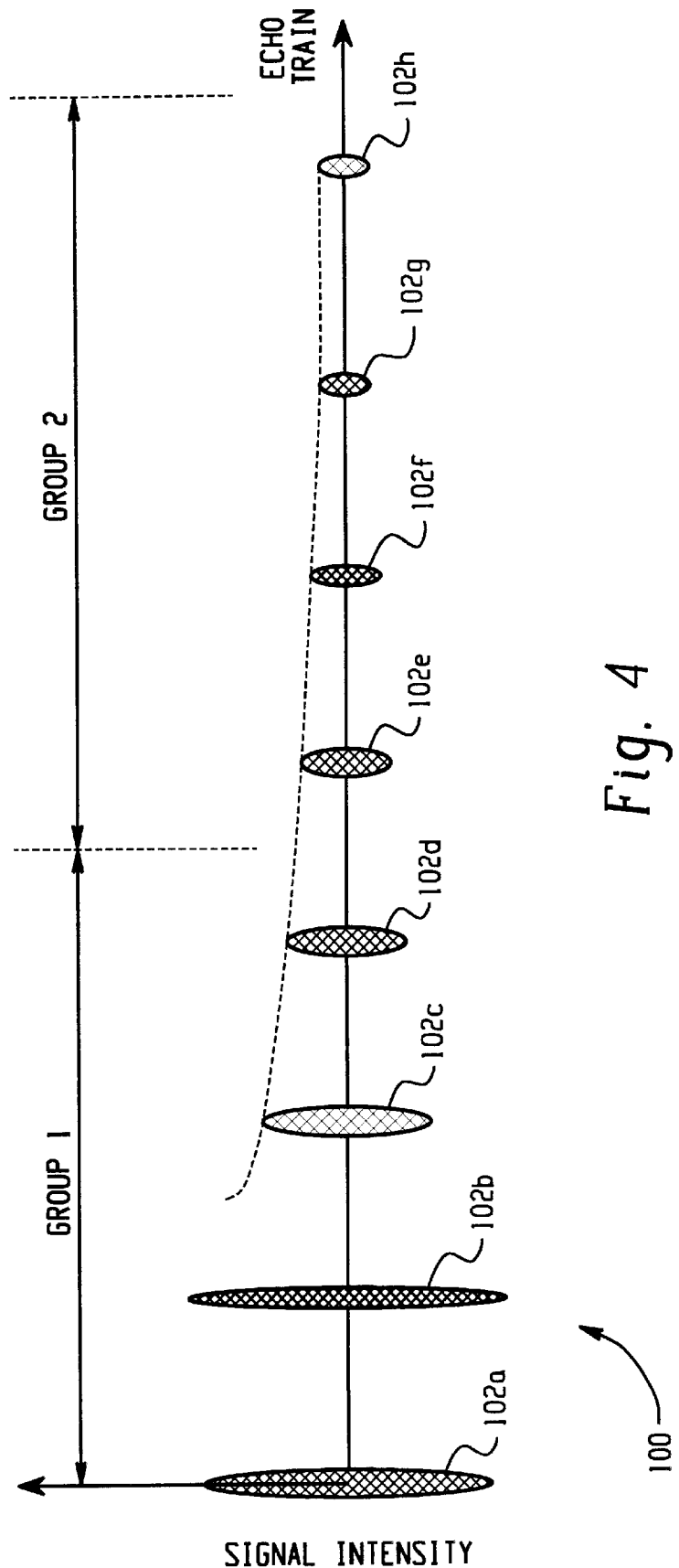

In a preferred embodiment, the above described MRI scanner is employed in a multiple contrast acquisition. With further reference to FIG. 4, an exemplary signal 100 including a multi-echo echo train having echos 102*a*–*h* is illustrated (in the interest of simplicity, only eight of the preferred 16 to 64 echos are shown). In the multiple contrast acquisition, different groups or sets of echos, e.g., Group 1 (echos 102*a*–*d*) and Group 2 (echos 102*e*–*h*), are designated for use in the reconstruction of separate image representations having different tissue contrast weighting. Each group or set of echos is sampled into its own k-space matrix from which the different images are reconstructed. In the example shown, the Group 2 echos 102*e–h* ultimately result in a T2-weighted image, and the Group 1 echos ultimately result in a PD-weighted image. While the groups shown are made up of consecutive echos, other groupings are possible. Additionally, more than two groups may be designated. However, only two are shown for simplicity herein. Moreover, the combination of different contrast weightings may include any desired combination weightings, including, e.g., T1, T2, or PD-weighting. Likewise, various spin preparations can be applied before data acquisition (e.g., FLAIR, IR, FatSat, etc.) to form a desired tissue contrast weighting.

Preferably, for each group or set of echos, the variable gain factor is individually selected for and/or set to different levels in order to achieve the highest quality image reconstruction possible from the respective group or set of echo, e.g., to achieve an optimum signal-to-noise ratio (SNR) for each of the corresponding images having different tissue contrast weightings. That is to say, due to differences in signal intensity levels between groups or sets of echos, the gain factor best suited to one group or set of echos in not necessarily best suited to another group or set of echos. For example, as shown, the PD-weighted image reconstructed using data from the Group 1 echos employs a lower gain factor that the T2-weighted image reconstructed using data from the Group 2 echos. Due to the natural signal decay, the Group 2 echos (i.e., the T2 echos) have relatively lower signal intensity levels as compared to the Group 1 echos (i.e., the PD echos).

More specifically, in the multiple contrast acquisition and image reconstruction, the echo having the highest signal intensity in each of the respective groups is used to determine the gain factor for its corresponding group or set of echos. For the example shown, this is echo 102*e* for Group 2, and echo 102*b* for Group 1. Note, in this example, a stimulated echo has been employed resulting in the second echo for Group 1 having the highest signal intensity. Typically, without the stimulated echo, the highest signal intensity for Group 1 is found in the first echo. In any event, the gain factor selected and set for each group is preferably the highest possible that does not result in signal clipping for that group or set of echos. In this regard, if a group's otherwise highest signal intensity echo is not clipped when subjected to the selected gain factor, none of the other echos in that group will be clipped either. Having identified the desired gain factor for each group or set of echos, the gain control processor 50 or 50' selects and/or sets the gain factor accordingly. In particular, with respect to the embodiment shown in FIG. 3A, the selection circuit or processor 60 selects and/or sets the channel corresponding to the desired gain factor, such that the highest gain factor possible is provided for which the flag on the associated output line 58*a* is not set. In the FIG. 3B embodiment, the components of the gain control processor 50' are dynamically adjusted to achieve the desired gain factor.

In the case of a single contrast application, it is not always the first or second echo (one or the other typically being the largest echo) that is positioned in the center of k-space. Rather, it depends on the type of contrast weighted image desired, e.g., more T1 or more T2 weighted. Accordingly, in a preferred single contrast acquisition and imaging embodiment, the variable gain factor is selected and set by the gain control processor 50 or 50' based upon the signal intensity of the echo which gets sampled or mapped to the center of k-space. The relevant gain factor employed is preferably the highest possible for which no signal clipping occurs with respect to the center k-space echo. Optionally, the gain factor selected then remains the same for each of the echos sampled into k-space for that image. Alternately, separate gain factors are independently identified for each echo.

Where each echo is subjected to an independently identified gain factor, the gain factors are preferably different. That is to say, the gain factor for each echo is selected as the highest possible for that echo which does not result in signal clipping for that echo. Due to the natural signal decay in a multiple echo train, such as the echo train 102, the gain factor progressively increases the further respective echos are down the train. Accordingly, for a preferred mapping of echos into k-space, as echos are progressively sampled as horizontal data lines into k-space from its center towards its upper and lower edges, the selected gain factor progressively increases.

In another preferred embodiment of the present invention, the variable gain factor is selected such that, within the sampling of a single echo, different gain factors are employed. The gain factor selected is preferably the largest for which each sampled point does not generate overflow in the ADC 58 or 58'. Again, preferably, as the signal amplitude tends to be larger towards the center of k-space, relatively higher gain factors tend to be selected for sampled data points towards the left and right edges of k-space. Optionally, there can be available 2, 3, 4, or more gain factors to select from, e.g., 2, 3, 4, or more different channels having different gain factors. In this manner, the available range of the ADC 58 or 58' is utilized to the greatest extend possible for the relevant sample points depending on their separate individual amplitudes.

Accordingly, by custom selecting the gain factor on an echo to echo basis or even on a sample to sample basis, the ability to resolve, differentiate, or discriminate between levels of signal is maintained across a wide range of different signal amplitudes. Of course, prior to loading the gain factor affected data into k-space, compensation for known gain differences is made. That is, the k-space data is linearized (e.g., for Fourier transform considerations) using the known differences in gain factors employed in conjunction with the relevant echos or samples.

Although a bore-type magnet is illustrated in FIG. 1, it is to be appreciated that the present invention is equally applicable to open magnet systems and other known types of MRI scanners.

The invention has been described with reference to preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance, imaging comprising:
 (a) applying an MRI pulse sequence to produce a detectable magnetic resonance signal in a selected region of a subject being imaged, said magnetic resonance signal including a plurality of echos;
 (b) receiving the plurality of echos, said plurality of echos including at least first and second distinct subsets of echos which are used respectively in reconstructing two separate image representations of the subject such that each image representation has a different tissue contrast weighting; and, (c) as the echos are received, subjecting the plurality of echos to a controllable gain factor such that said first subset of echos are each subjected to a first gain factor and said second subset of echos are each subjected to a second gain factor different from the first gain factor, said first and second gain factors being set in response to amplitudes of echos from the magnetic resonance signal.

2. The method according to claim 1, wherein one of the two separate image representations has a tissue contrast weighting which is selected from a group consisting of T1-weighting, T2-weighting, and PD-weighting, and the other of the two separate image representations has a different tissue contrast weighting selected from the same group.

3. The method according to claim 2, wherein one of the two separate image representations is PD-weighted and is reconstructed using echos having a lower gain factor than echos used to reconstruct the other of the two separate image representations which is T2-weighted.

4. A method of magnetic resonance imaging comprising:

(a) supporting a subject in an examination region of an MRI scanner;

(b) applying an MRI pulse sequence to produce a detectable magnetic resonance signal in a selected region of the subject, said magnetic resonance signal comprising one or more echos;

(c) receiving the magnetic resonance signal;

(d) selectively subjecting the magnetic resonance signal to a variable gain factor, said variable gain factor being dynamically regulated during the MRI pulse sequence in response to an amplitude of the magnetic resonance signal received from the subject;

(e) sampling the gain factor affected magnetic resonance signal into k-space as k-space data; and, (f) reconstructing the k-space data into an image erpresentation of the subject.

5. The method according to claim 4, wherein different gain factors are selected for different echos.

6. The method according to claim 4, wherein at a center of k-space the variable gain factor selected is relatively lower than at edges of k-space.

7. An MRI scanner comprising:

a main magnet that generates a substantially uniform temporally constant main magnetic field through an examination region wherein an object being imaged is positioned;

a gradient magnetic field generator that produces magnetic gradients in the main magnetic field across the examination region;

an RF magnetic field generator which includes an RF transmitter that drives an RF coil which is proximate to the examination region;

a sequence control which manipulates the gradient magnetic field generator and the RF magnetic field generator to produce an MRI pulse sequence, said MRI pulse sequence producing detectable magnetic resonance signals in the object, said signals including one or more echos;

a reception system which includes a receiver that receives and demodulates the signals, and a gain control that selectively subjects the magnetic resonance signals to a variable gain factor, said variable gain factor being dynamically regulated during the MRI pulse sequence in response to an amplitude of the magnetic resonance signals received from the object;

a reconstruction processor that reconstructs images of the object from data collected via the reception system; and, an output device that produces a human viewable rendering of the images.

8. The MRI scanner according to claim 7, wherein the gain control subjects each of the echos to one of a first gain factor and a second gain factor, said second gain factor being different from said first gain factor.

9. The MRI scanner according to claim 8, wherein the reconstruction processor reconstructs a first image and a second image, said first image being reconstructed using data from echos subjected to the first gain factor and said second image being reconstructed using data from echos subjected to the second gain factor.

10. The MRI scanner according to claim 9, wherein the first image has a contrast weighting which is selected from a group consisting of T1-weighting, T2-weighting, and PD-weighting, and the second image has a different contrast weighting selected from the same group.

11. The MRI scanner according to claim 8, wherein the reconstruction processor reconstructs an image using data from echos that where subjected to different gain factors.

12. The MRI scanner according to claim 8, wherein the gain control includes a processing channel having a dynamically adjustable gain factor.

13. The MRI scanner according to claim 12, wherein the processing channel includes at least one dynamically adjustable element selected from a group consisting of a dynamically adjustable amplifier, a dynamically adjustable attenuator, and a dynamically adjustable ADC.

14. An MRI scanner which produces detectable magnetic resonance signals in an object being imaged, said magnetic resonance signals including one or more echos, the MRI scanner comprising:

a receiver that receives the magnetic resonance signals; and, a gain control that selectively subjects the received magnetic resonance signals to a gain factor that is varied during imaging; said gain control including:

a plurality of parallel channels through which each echo is processed, said channels each providing a different gain factor; and, a selection processor, said selection processor operating such that the channel corresponding to the desired gain factor for the echo is selected as the gain control's output.

15. The MRI scanner according to claim 14, wherein each channel includes:

an associated ADC which converts the echos being processed through each channel from an analog signal to a digital signal, said ADCs clipping signals exceeding a defined amplitude.

16. The MRI scanner according to claim 15, wherein the ADCs set flags when they clip signals, said flags being communicated to the selection processor to thereby indicate which channels have clipped signals.

17. The MRI scanner according to claim 15, wherein the gain control sets the variable gain factor for a selected set of echos by said selection processor selecting that channel having the highest gain factor without the ADC clipping the signals for the echos in the selected set.

18. A method of magnetic resonance imaging comprising:

(a) applying an MRI pulse sequence to produce a detectable magnetic resonance signal in a selected region of a subject being imaged, said magnetic resonance signal comprising one or more echos;

(b) receiving the magnetic resonance signal;

(c) as the magnetic resonance signal is received, selectively subjecting the magnetic resonance signal to a variable gain factor such that different gain factors are selected for different sample points within the same echo;

(d) sampling the gain factor affected magnetic resonance signal into k-space as k-space data; and, (e) reconstructing the k-space data into an image representation of the subject.

* * * * *